(12) United States Patent
Lu et al.

(10) Patent No.: US 7,344,995 B2
(45) Date of Patent: Mar. 18, 2008

(54) METHOD FOR PREPARING A STRUCTURE WITH HIGH ASPECT RATIO

(75) Inventors: Hung Yueh Lu, Hsinchu (TW); Hong Long Chang, Hsinchu (TW); Yung Kai Lee, Tongluo Township (TW); Chih Hao Chang, Taichung (TW)

(73) Assignee: Promos Technologies, Inc., Hsinchu (TW)

( * ) Notice: Subject to any disclaimer, the term of this patent is extended or adjusted under 35 U.S.C. 154(b) by 348 days.

(21) Appl. No.: 11/078,435

(22) Filed: Mar. 14, 2005

(65) Prior Publication Data

US 2006/0160366 A1 Jul. 20, 2006

(30) Foreign Application Priority Data

Jan. 19, 2005 (TW) ............................... 94101517 A

(51) Int. Cl.
*H01L 21/302* (2006.01)
(52) U.S. Cl. ...................... 438/717; 438/702; 438/734; 438/740
(58) Field of Classification Search ................ 438/717, 438/734
See application file for complete search history.

(56) References Cited

U.S. PATENT DOCUMENTS

| 3,599,031 | A | * | 8/1971 | Beggs | ........................ 313/268 |
|---|---|---|---|---|---|
| 5,110,752 | A | * | 5/1992 | Lu | ............................... 438/398 |
| 5,858,877 | A | * | 1/1999 | Dennison et al. | ........... 438/700 |
| 6,087,269 | A | * | 7/2000 | Williams | ..................... 438/735 |
| 6,451,705 | B1 | * | 9/2002 | Trapp et al. | ................. 438/723 |
| 6,593,246 | B1 | * | 7/2003 | Hasegawa et al. | .......... 438/736 |

OTHER PUBLICATIONS

Wolf et al, Silicon Processing for the VLSI Era, vol. 1: Process Technology, Lattice Press: Sunset Beach, CA, 2000, pp. 177-178.*

* cited by examiner

*Primary Examiner*—Carl Whitehead, Jr.
*Assistant Examiner*—Colleen E. Rodgers
(74) *Attorney, Agent, or Firm*—Oliff & Berridge, PLC

(57) ABSTRACT

The present invention discloses a method for preparing a structure with high aspect ratio, which can be a trench or a conductor. A first mask is formed on a substrate, and a first etching process is performed to remove the substrate uncovered by the first mask to form at least one concavity. A second mask is formed on the surface of the prepared structure, a second etching process is then performed to remove the second mask on the concavity, and a third etching process is performed subsequently to extend the depth of the concavity into the substrate. To prepare a conductor with high aspect ratio in the substrate, the first mask and the second mask are preferably made of dielectric material or metal. In addition, to prepare a trench with high aspect ratio in a silicon substrate, the first mask and the second mask are preferably made of dielectric material.

11 Claims, 8 Drawing Sheets

METHOD FOR PREPARING A STRUCTURE WITH HIGH ASPECT RATIO

BACKGROUND OF THE INVENTION (A) Field of the Invention

The present invention relates to a method for preparing a structure with high aspect ratio, and more particularly, to a method for preparing a structure with high aspect ratio using a multi-stage etching process incorporating two masks.

(B) Description of the Related Art

FIG. 1 to FIG. 3 are schematic diagrams showing a method for preparing a conductor 22 on a wafer 10 according to the prior art. The wafer 10 comprises a substrate 12, a conductive layer 14 and a dielectric layer 16. At first, a photoresist pattern 18 is formed on the dielectric layer 16 and an etching process is then performed to form a mask pattern 20, wherein the etching process not only removes the dielectric layer 16, but also removes the photoresist pattern 18 completely, as shown in FIG. 2.

Referring to FIG. 3, another etching process is performed to remove a portion of the conductive layer 14 uncovered by the mask pattern 20 to form a conductor 22. The etching process removes not only the conductive layer 14 uncovered by the mask pattern 20, but also removes a portion of the mask pattern 20. In other words, the mask pattern 20 cannot prevent the conductive layer 14 from being removed partially, which will result in an arc profile at the corner of the conductor 22 rather than an expected rectangle profile (shown with dashed line). Consequently, the cross-sectional area of the conductor 22 will reduce, causing the resistance to increase, which is adverse to the conduction of electricity.

In addition, to form a structure with high aspect ratio by increasing the reaction time of the etching process, the mask pattern 20 will be removed completely during the etching process and the conductive layer 14 below the mask pattern 20 will not be prevented from etching. That is, the prior art method does not have the ability to etch downward further to form a structure with high aspect ratio. Consequently, the prior art method is only applicable to preparing the conductor 22 with a lower height, i.e., a structure with smaller aspect ratio, and cannot be used to prepare a structure with high aspect ratio.

SUMMARY OF THE INVENTION

The objective of the present invention is to provide a method for preparing a structure with high aspect ratio using a multi-stage etching process incorporating two masks.

In order to achieve the above-mentioned objective and avoid the problems of the prior art, the present invention discloses a method for preparing a structure with high aspect ratio, which can be a trench or a conductor. The present method forms a first mask on a substrate, and then performs a first etching process to remove the substrate uncovered by the first mask to form at least one concavity. A second mask is formed on the surface of the structure according to the above-mentioned process, a second etching process is then performed to remove the second mask on the concavity, and a third etching process is performed subsequently to extend the depth of the concavity into the substrate.

To prepare a conductor with high aspect ratio in the substrate, the first mask and the second mask are preferably made of dielectric material or metal. In addition, to prepare a trench with high aspect ratio in a silicon substrate, the first mask and the second mask are preferably made of dielectric material. The dielectric material can be formed on the substrate (or silicon substrate) by a chemical vapor deposition process, and the metal can be formed on the substrate by a physical vapor deposition process.

Compared to the prior art, as the first mask cannot prevent the substrate below from being etched, the present invention forms the second mask above the first mask by the deposition technique with a poor step coverage ability incorporating the etching technique, and performs another stage of the etching process to form a structure with high aspect ratio.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
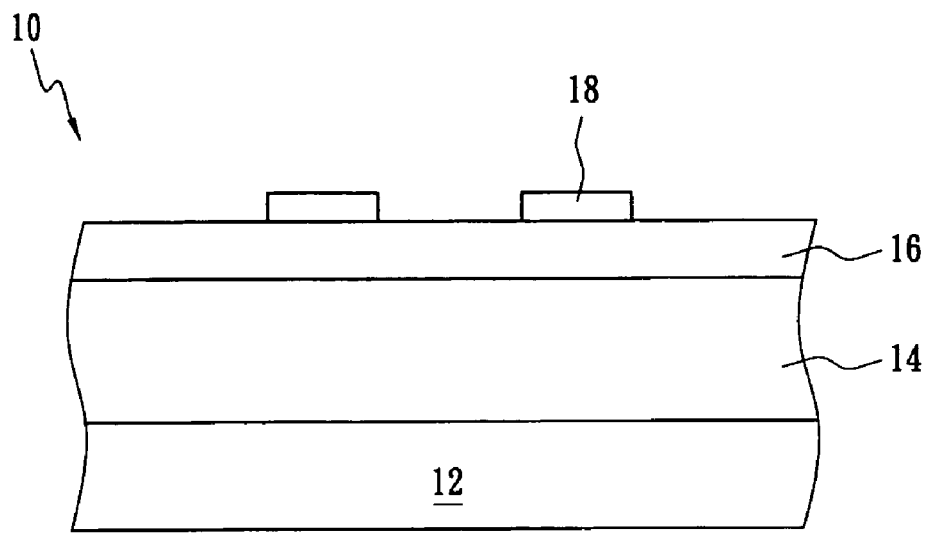
FIG. 1 to FIG. 3 are schematic diagrams showing a method for preparing a conductor on a wafer according to the prior art.
Figure 2:
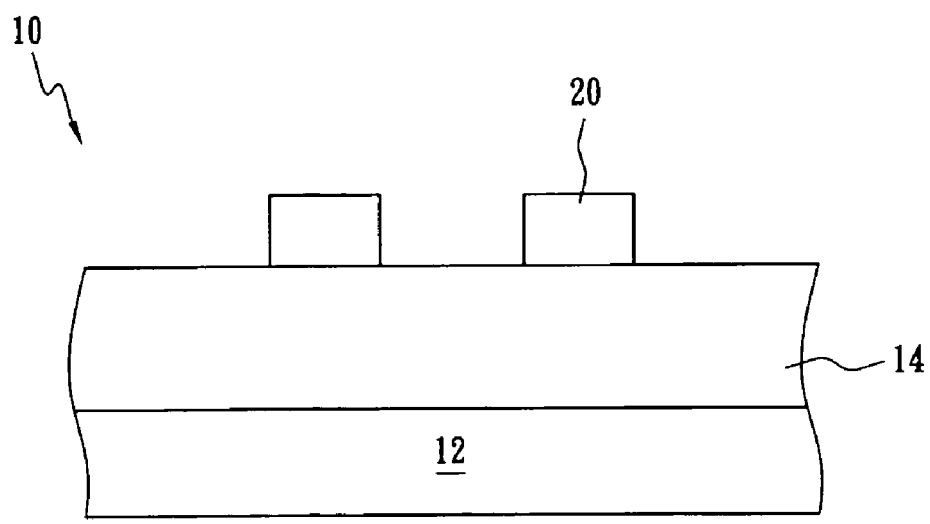
Figure 3:
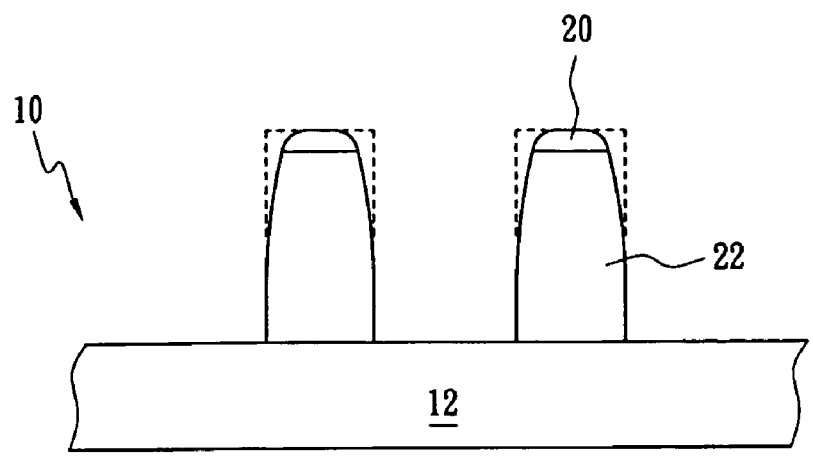
Figure 4:
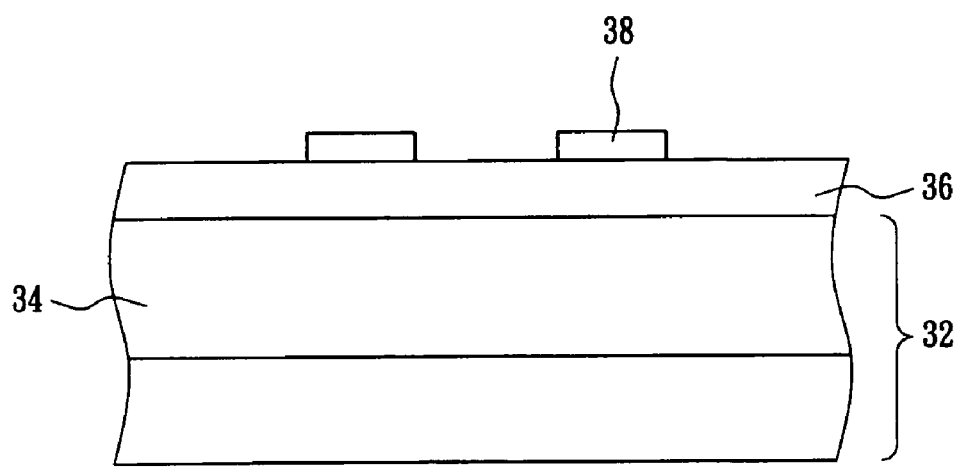
FIG. 4 to FIG. 9 illustrate a method of preparing a structure with high aspect ratio according to the first embodiment of the present invention.
Figure 5:
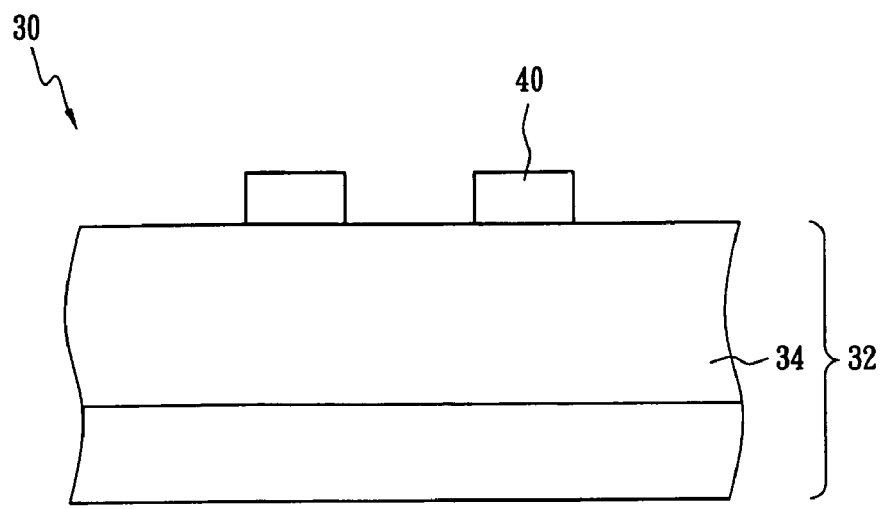

FIG. 4 to FIG. 9 illustrate a method for preparing a structure with high aspect ratio according to the first embodiment of the present invention, which can prepare a conductor 48 such as a metal line on a wafer 30. The wafer 30 comprises a substrate 32 including a conductive layer 34. Preferably, the conductive layer 34 can be a multi-layer structure including a titanium nitride layer (or a titanium nitride layer and a titanium layer), an aluminum layer and a titanium layer (or a titanium nitride layer and a titanium layer) from top to bottom. At first, a first layer 36 is deposited on the conductive layer 34, and at least one photoresist pattern 38 is formed on the first layer 36. The first layer 36 can be deposited by a chemical vapor deposition (CVD) process using tetraethoxysilane, i.e., using the CVD process to form a first dielectric layer. Later, the first layer 36 is etched to form a first mask 40 on the substrate 32, as shown in FIG. 5.

Figure 6:
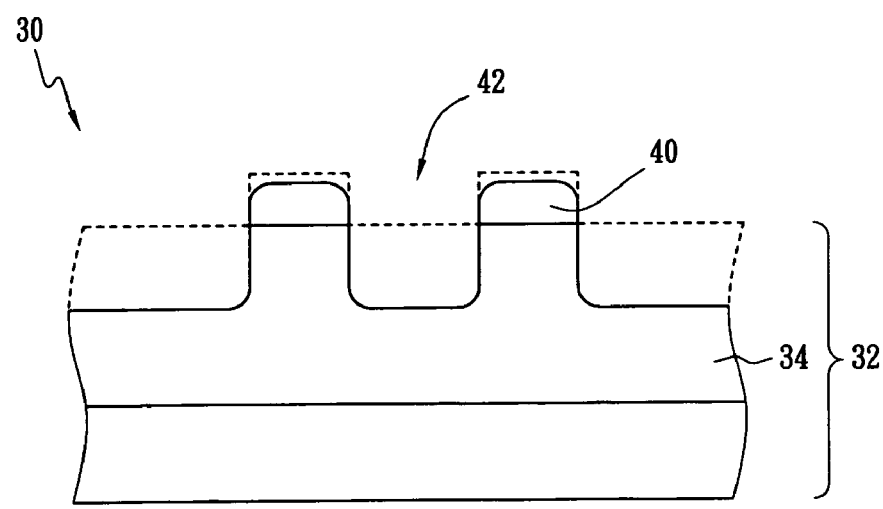
Figure 7:
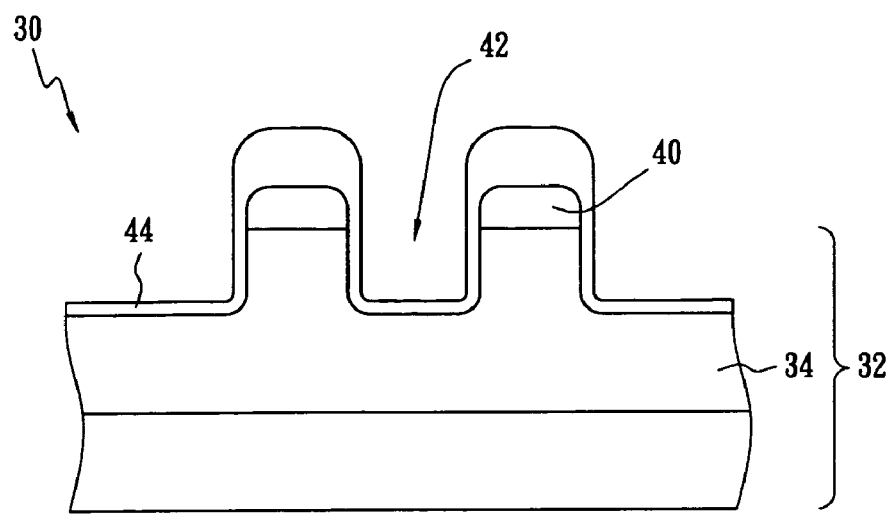

Referring to FIG. 6 and FIG. 7, an etching process is performed to remove a portion of the conductive layer 34 uncovered by the first mask 40 to form at least one concavity 42 in the conductive layer 34. The etching process can be a dry etching process using etching gases including methane, chlorine, boron trichloride, argon and oxygen. A second layer 44 is deposited on the substrate 32 by plasma enhanced CVD (PECVD), i.e., using the CVD process to form a second dielectric layer.

Due to the poor step coverage ability of the PECVD process, the thickness of the second layer 44 above the first mask 40 is greater than that above the concavity 42. In other words, the second layer 44 is preferably prepared by a deposition process with a poor step coverage ability so that the thickness of the second layer 44 is larger above the first mask 40, but smaller above the concavity 42.

Figure 8:
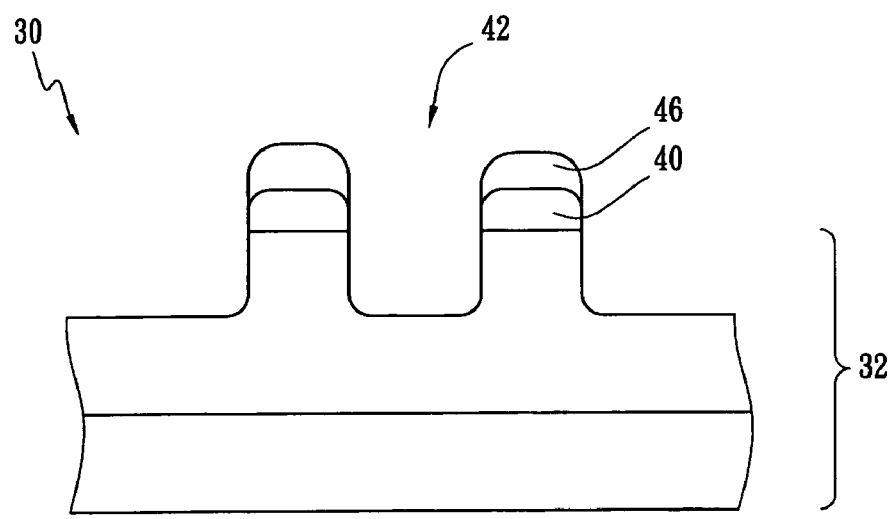

Referring to FIG. 8, a dry etching process is performed to completely remove the second layer 44 on the concavity 42, but selectively leave a portion of the second layer 44 on the first mask 40 to form a second mask 46 on the first mask 40. The etching process can be a dry etching process using etching gases including octafluorocyclopentene, argon, carbon tetrafluoride and oxygen. Since the thickness of the second layer 44 is larger above the first mask 40 but smaller above the concavity 42, the dry etching process can selectively remove the second layer 44 on the concavity 42 to expose the conductive layer 34 on the concavity 42, but leave the second layer 44 on the first mask 40 to form the second mask 46.

Figure 9:
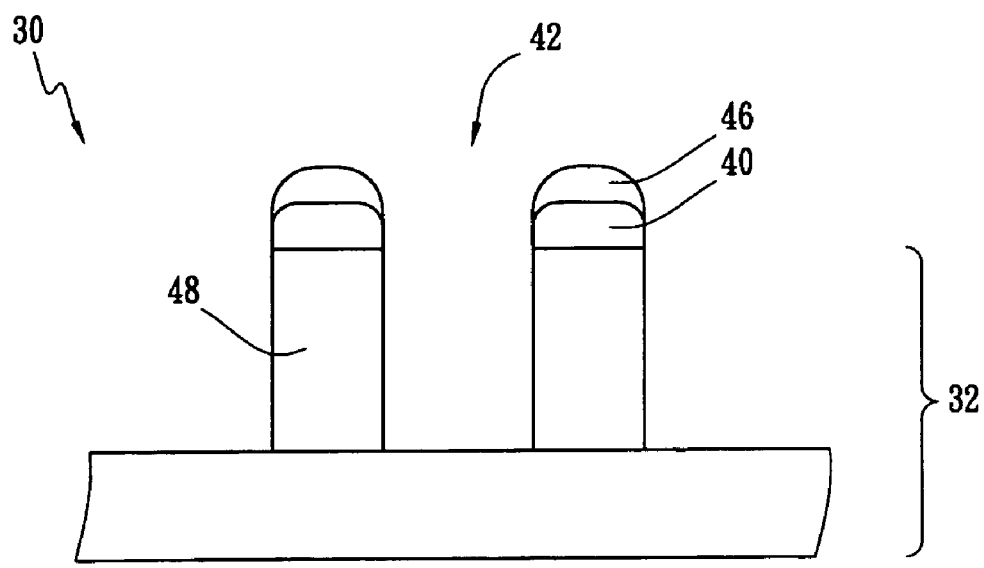
Figure 10:
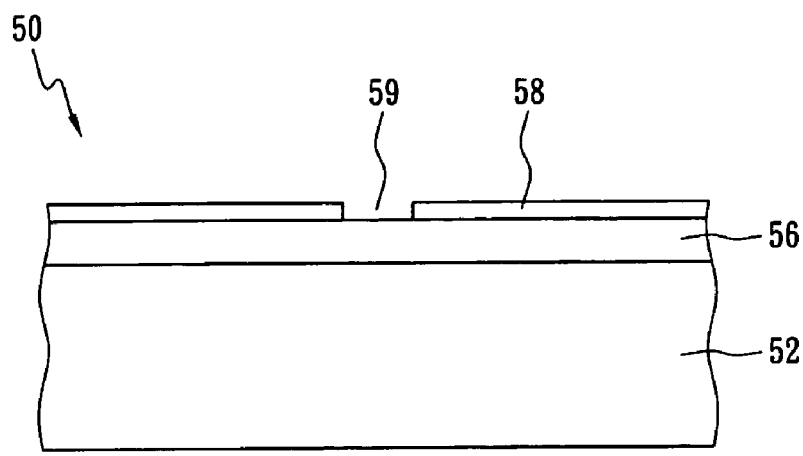
FIG. 10 to FIG. 15 illustrate a method for preparing a structure with high aspect ratio according to the second embodiment of the present invention.

Referring to FIG. 9, another etching process is performed to completely remove the conductive layer 34 uncovered by the first mask 40 and the second mask 46, i.e., to extend the depth of the concavity 42 into the substrate 32 to form conductors 48. The etching process can be a dry etching process using etching gases including methane, chlorine, boron trichloride, argon and oxygen. In brief, the conductor 48 with high aspect ratio can be actually prepared because the present invention uses the multi-stage etching process to remove the conductive layer 34 uncovered by the hard mask (the first mask 40 and the second mask 46).

In case the first mask 40 cannot prevent the conductive layer 34 from being etched during the first stage of the etching process, the present invention forms the second mask 46 on the first mask 40 by the deposition technique with a poor step coverage ability incorporating an etching technique, and performs the second stage of the etching process on the conductive layer 34 to form the conductor 48 with high aspect ratio. Similarly, in case the second mask 46 still cannot prevent the conductive layer 34 from being etched, the present invention can form another mask above the second mask 46, and it performs a third stage of the etching process on the conductive layer 34 to form the conductor 48 with an even higher aspect ratio.

The first layer 36 and the second layer 44 can be made of metal as well as dielectric material. For example, the conductive layer 34 can consist of aluminum, and the second layer 44 can be formed by a deposition technique with relatively poor step coverage ability. For example, if the conductive layer 34 is made of aluminum, the first mask 40 and the second mask 46 can be prepared from the first layer 36 and the second layer 44 made of tungsten.

Further, if the second mask 46 is made of tungsten, the second layer 44 on the surface of the concavity 42 can be removed by a dry etching process using etching gases including sulphur hexafluoride, fluoroform and oxygen. Preferably, there is a certain etching selectivity between the conductive layer 34 and the first mask 40 (the same criteria applied to the second mask 46), so that the dry etching process can selectively remove the conductive layer 34, but leave the first mask 40 and the second mask 46. Particularly, the etching selectivity is preferably greater than 3, and the etching selectivity between aluminum and tungsten for the above-mentioned dry etching process, using methane, chlorine, boron trichloride, argon and oxygen as the etching gases, is greater than 5.

Figure 11:
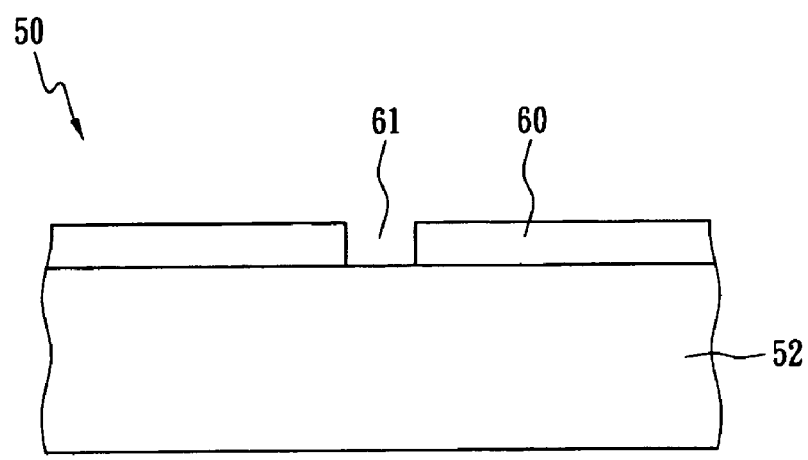

FIG. 10 to FIG. 15 illustrate a method for preparing a structure with high aspect ratio according to the second embodiment of the present invention, which can prepare a trench 68 on the wafer 50 including a silicon substrate 52. At first, a first dielectric layer 56 is deposited on the silicon substrate 52, and a photoresist layer 58 with an opening 59 is formed on the first dielectric layer 56. The first dielectric layer 56 can be deposited by the CVD process using tetraethoxysilane. The first dielectric layer 56 is then etched to form a first mask 60 with an opening 61 on the silicon substrate 52, as shown in FIG. 11.

Figure 12:
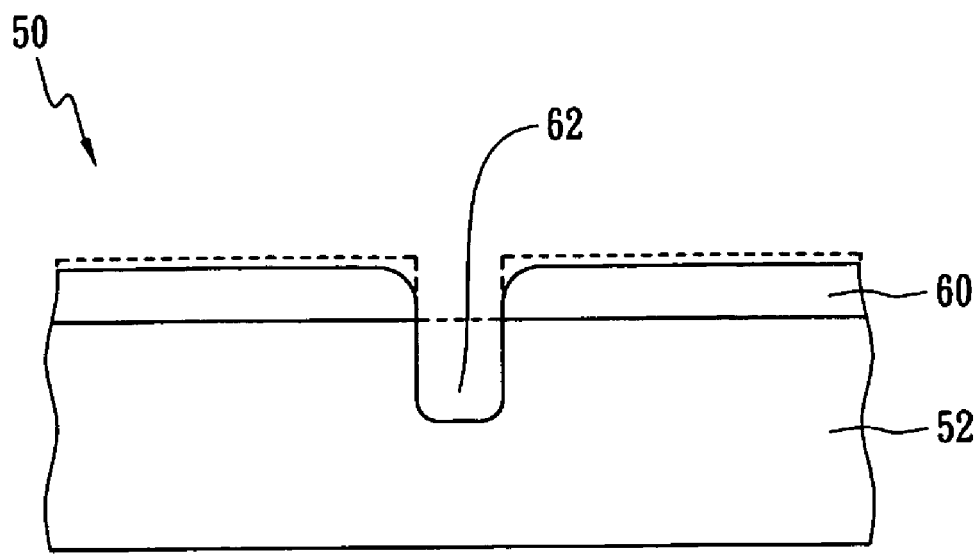
Figure 13:
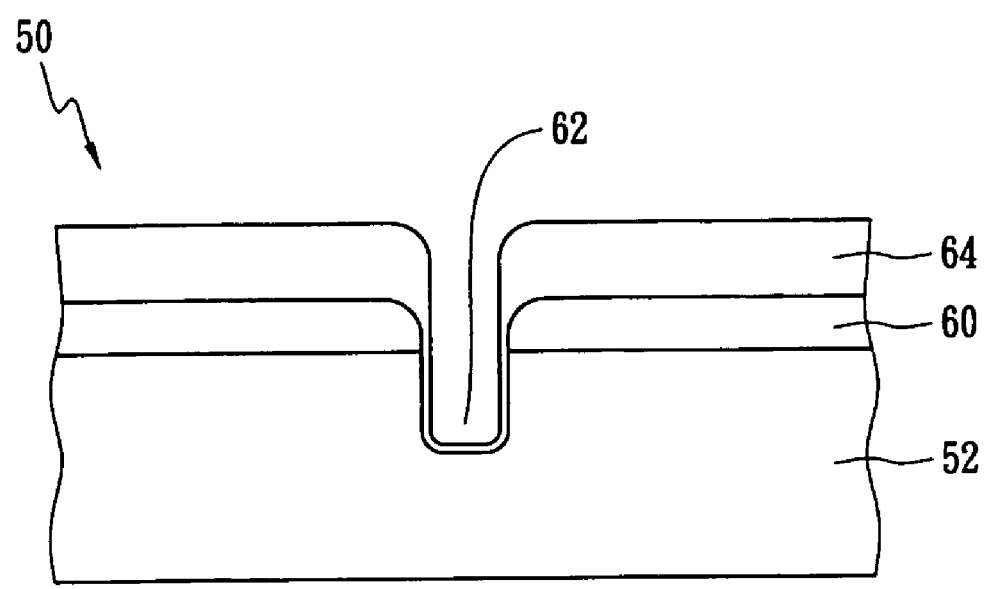

Referring to FIG. 12, an etching process is performed to remove a portion of the silicon substrate 52 uncovered by the first mask 60 to form at least one concavity 62 in the silicon substrate 52. Later, a second dielectric layer 64 is deposited on the wafer 50 by the CVD process using tetraethoxysilane, as shown in FIG. 13. Since the CVD process using tetraethoxysilane possesses poor step coverage ability, the thickness of the second dielectric layer 64 above the first mask 60 is greater than that above the concavity 62.

Figure 14:
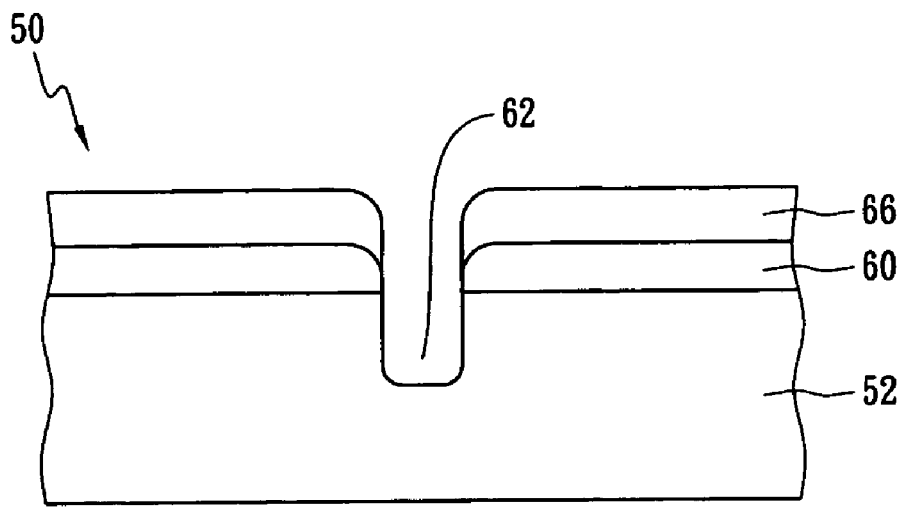
Figure 15:
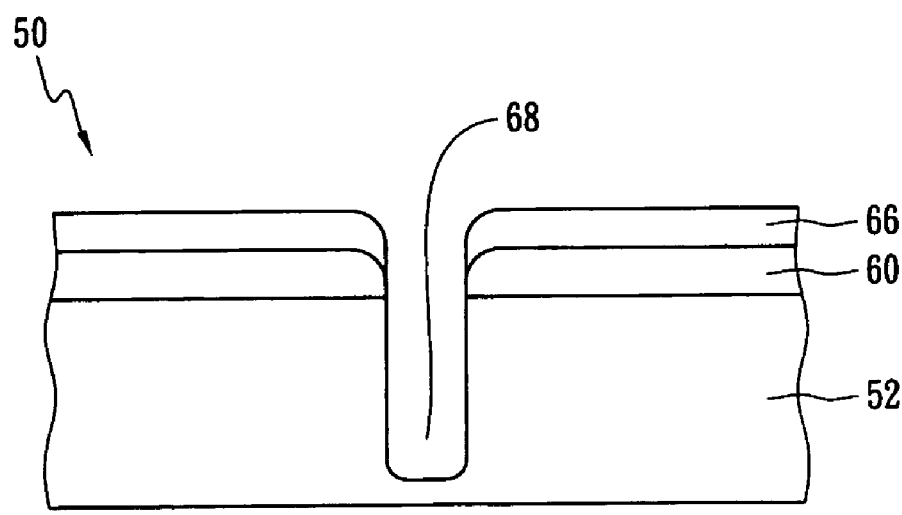

Referring to FIG. 14, a dry etching process is performed to remove the second dielectric layer 64 on the surface of concavity 62, but selectively leaves the second dielectric layer 64 on the first mask 60 to form a second mask 66. Since the thickness of the second dielectric layer 64 above the first mask 60 is greater than that above the concavity 62, the dry etching process can selectively remove the second dielectric layer 64 on the surface of the concavity 62 to expose the silicon substrate 52 in the concavity 62, but leave the second dielectric layer 64 above the first mask 60 to form the second mask 66. Another etching process is performed to remove the silicon substrate 52 uncovered by the first mask 60 and the second mask 66, i.e., to extend the depth of the concave 62 into the silicon substrate 52 to form a trench 68, as shown in FIG. 15.

To prepare a conductor, the prior art method performs one etching process using a hard mask to form a conductor with an arc profile, which will increase the resistance of the conductor due to the reduced cross-sectional area. To the contrary, as the first mask cannot prevent the substrate below from being etched, the present invention forms the second mask above the first mask by the deposition technique with a poor step coverage ability incorporating the etching technique, and performs another stage of the etching process to form a structure with high aspect ratio. Consequently, using the present invention to prepare a conductor can ensure the profile of the conductor with a desired high aspect ratio to ensure the cross-sectional area and the resistance of the conductor. In addition, the present invention can also be used to prepare the trench with high aspect ratio.

The above-described embodiments of the present invention are intended to be illustrative only. Numerous alternative embodiments may be devised by those skilled in the art without departing from the scope of the following claims.

What is claimed is:

1. A method for preparing a structure with high aspect ratio, comprising steps of:
   depositing a first layer made of dielectric material or metal by a chemical vapor deposition process on a conductive layer of a substrate;
   forming at least one photoresist pattern on the first layer;
   etching the first layer to form a first mask on the substrate;
   performing a first etching process to remove a portion of the substrate uncovered by the first mask to form at least one concavity;
   forming a second mask on the first mask by a process comprising at least a step of depositing a second layer on the substrate and a step of removing a portion of the second layer on the surface of the at least one concavity, wherein the step of removing a portion of the second layer on the surface of the at least one concavity is a dry etching process using etching gases including octafluorocyclopentene, argon, carbon tetrafluoride and oxygen; and
   performing a second etching process to extend the depth of the at least one concavity into the substrate.

2. The method for preparing a structure with high aspect ratio of claim 1, wherein the etching selectivity of the first etching process between the conductive layer and the first layer is greater than three.

3. The method for preparing a structure with high aspect ratio of claim 1, wherein the dielectric material is tetraethoxysilane.

4. The method for preparing a structure with high aspect ratio of claim 1, wherein the conductive layer is an aluminum layer, and the metal is tungsten.

5. The method for preparing a structure with high aspect ratio of claim 1, wherein the conductive layer comprises aluminum, and the first etching process is a dry etching process using etching gases including methane, chlorine, boron trichloride, argon and oxygen.

6. The method for preparing a structure with high aspect ratio of claim 1, wherein the etching selectivity of the second etching process between the conductive layer and the second layer is greater than three.

7. The method for preparing a structure with high aspect ratio of claim 1, wherein the step of depositing the second layer on the substrate is a plasma enhanced chemical vapor deposition process.

8. The method for preparing a structure with high aspect ratio of claim 1, wherein the second layer is made of dielectric material or metal.

9. The method for preparing a structure with high aspect ratio of claim 1, wherein the step of depositing the second layer on the substrate is a chemical vapor deposition process for tungsten.

10. The method for preparing a structure with high aspect ratio of claim 1, wherein the step of forming the second mask on the first mask comprises:

depositing a second dielectric layer on the substrate; and
removing a portion of the second dielectric layer on the surface of the concavity to form the second mask.

11. The method for preparing a structure with high aspect ratio of claim 10, wherein the step of depositing the second dielectric layer on the substrate is a plasma enhanced chemical vapor deposition process.

* * * * *